United States Patent
Lamant

(10) Patent No.: US 7,861,205 B2
(45) Date of Patent: Dec. 28, 2010

(54) SPINE SELECTION MODE FOR LAYOUT EDITING

(75) Inventor: Gilles S. C. Lamant, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 333 days.

(21) Appl. No.: 12/168,295

(22) Filed: Jul. 7, 2008

(65) Prior Publication Data

US 2010/0004902 A1  Jan. 7, 2010

(51) Int. Cl.
   *G06F 17/50* (2006.01)
(52) U.S. Cl. .............................. 716/12; 716/13; 716/14
(58) Field of Classification Search .............. 716/12–14
   See application file for complete search history.

(56) References Cited

U.S. PATENT DOCUMENTS 6,678,876 B2 *  1/2004  Stevens et al. ................. 716/12
7,257,797 B1 *  8/2007  Waller et al. ................... 716/14

* cited by examiner

*Primary Examiner*—Jack Chiang
*Assistant Examiner*—Nghia M Doan
(74) *Attorney, Agent, or Firm*—Schwegman, Lundberg & Woessner, P.A.

(57) ABSTRACT

Methods, software, and systems implementing software provide for accepting a user's selection of a database object defining layout being displayed. The database objects can include objects defining paths and path segments. Automatic layout tools may be used in creating at least some of the objects. The user's selection begins a recursive process of automatically selecting additional database objects based on criteria designed to create an uninterrupted spine from database objects on a single interconnect layer, of the same width, and collectively arranged such that the spine has a first end and a second end, and can be traced from the first end to the second end without backtracking.

20 Claims, 7 Drawing Sheets

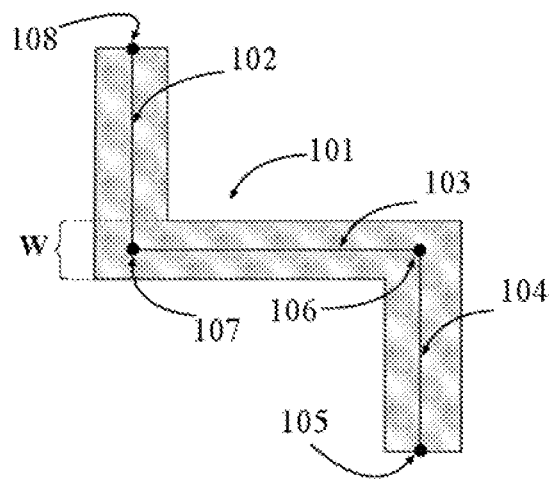
FIG. 1
Background
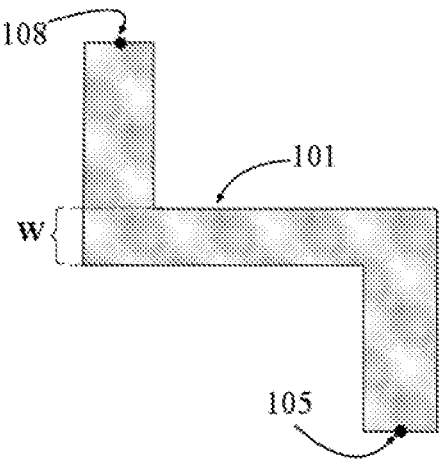
FIG. 2
Background
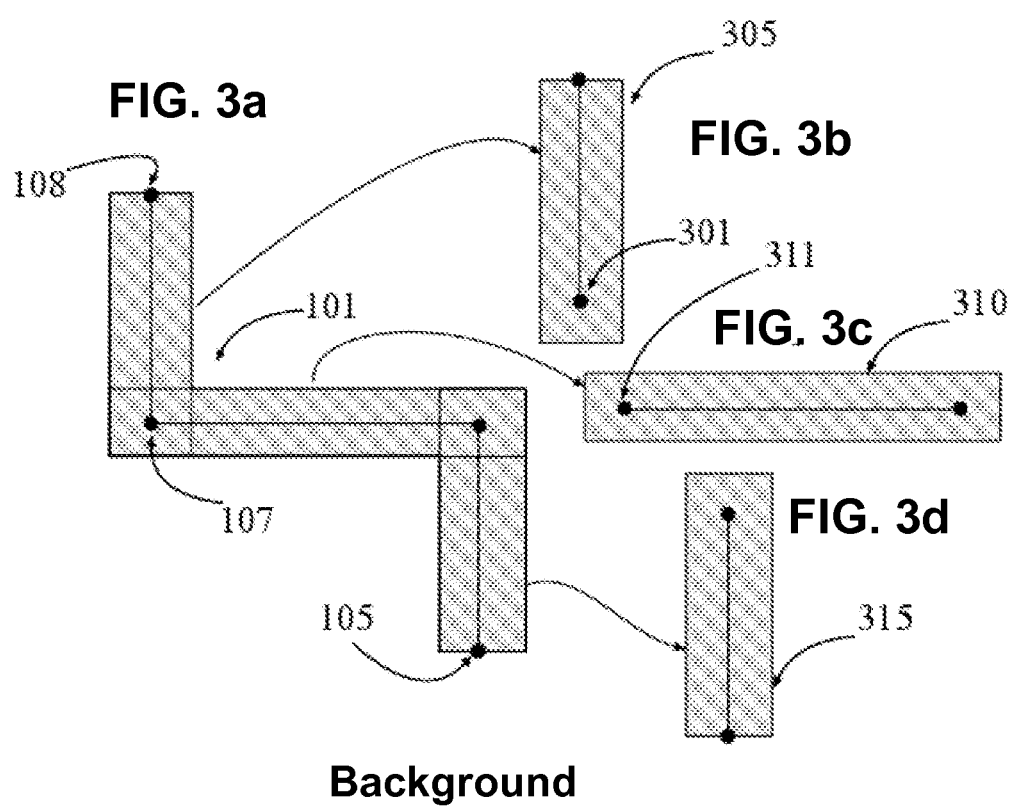
Background

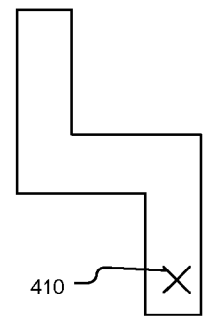
Background
FIG. 4
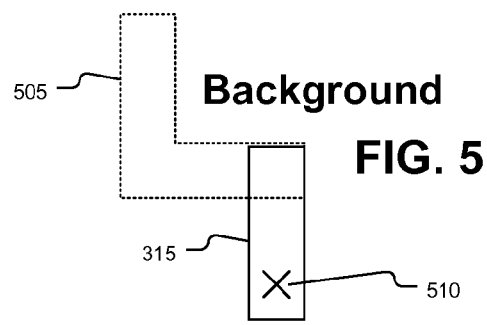
Background
FIG. 5
FIG. 6
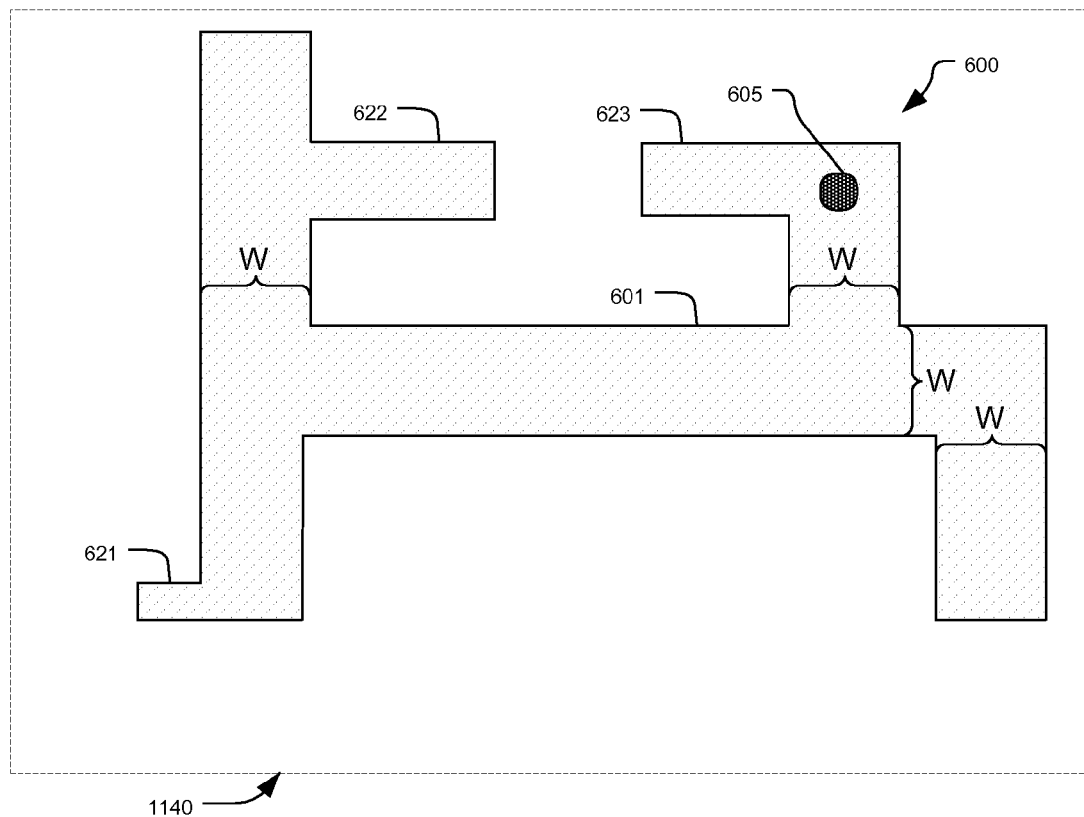

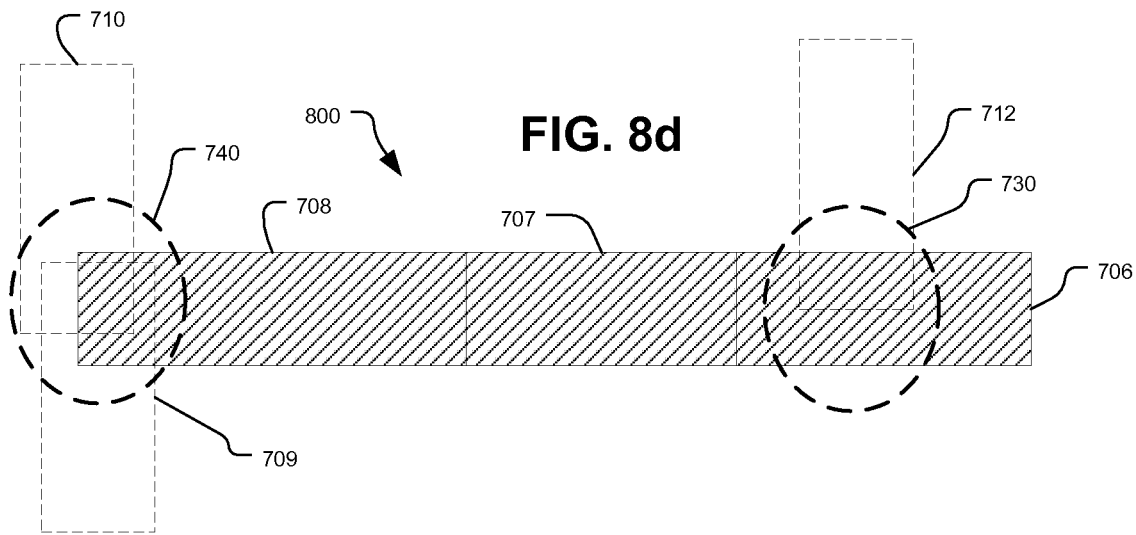
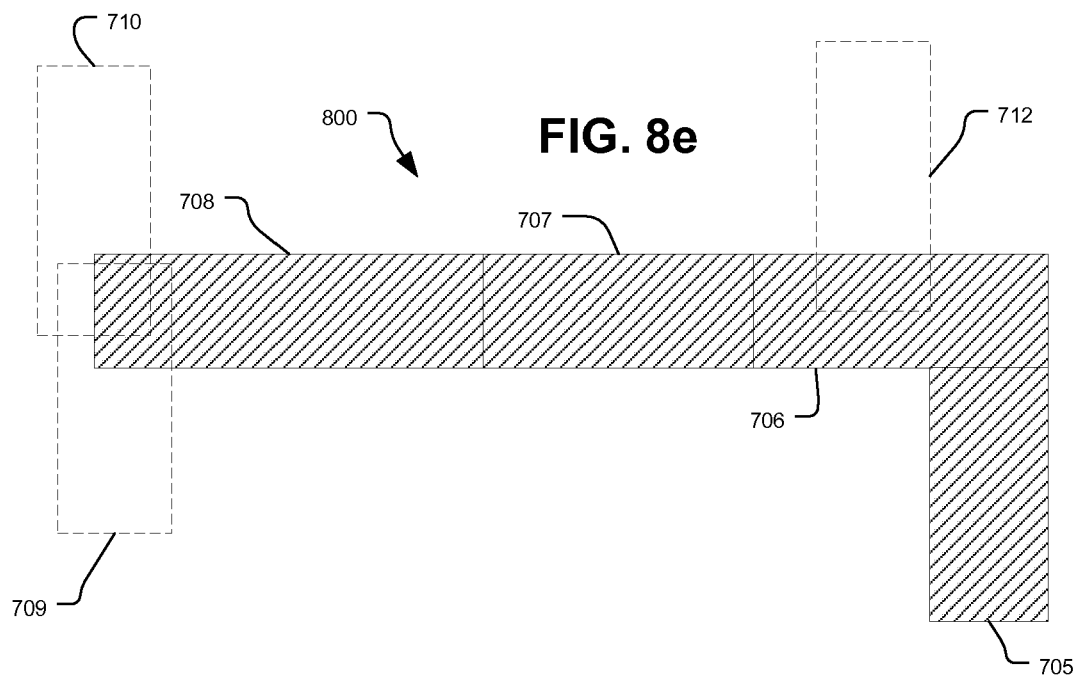

SPINE SELECTION MODE FOR LAYOUT EDITING

FIELD

Aspects of the invention relate to tools for user editing and creation of layout for integrated circuits, and more specifically to ways to provide an aid to a user in editing of multiple logically related but physically independent database objects.

BACKGROUND

Layout tools use databases for storing objects defining portions of layout for an integrated circuit, such as portions of layout for a plurality of nets in the integrated circuit. For example, one database which can be used by design tools, such as Cadence's Virtuoso tool, is OpenAccess. The objects stored in an OpenAccess database can comprise a path object, and a path segment object, and other types of objects.

A path object is defined by a list of points defining multiple consecutive but not necessarily co-linear portions of interconnect, all formed on a single layer and of the same width. FIG. 1 illustrates a portion of layout for an example path object 101 composed of a plurality of portions 102, 103 and 104. The portions are created between points 105, 106, 107, and 108 that would be stored in a data structure representing a computer readable representation of path object 101. Path object 101 can be created by a designer who may specify each point and also specify a width for the path that is to connect each of those points.

FIG. 2 illustrates physical layout for path object 101 having width W. A user, when editing such a path object with a layout editor and selecting any point within a display of layout for path object 101 would cause selection of path object 101 in its entirety.

As evident from FIGS. 1 and 2, a path object is a single width, single layer portion of interconnect that may contain turns, and so would be defined by a beginning, an end, and zero or more intermediate points defining turns for that path object.

By contrast, a path segment object is defined as a single width, single layer linear strip of interconnect having a beginning and an end (i.e., there are no turns in a path segment object). Each such path segment is a separate layout database object that itself does not contain information about a higher-level construct of which it may be a part. In other words, even though a series of these path segments may be used by a tool to create an electrical connection between two circuit nodes, each path segment database object has no information about other path segments used in forming that connection. So, in a layout design tool, without any assistance to a designer, selecting layout corresponding to a given path segment generally would cause selection only of that single path segment object. Path segments objects are often preferred by automatic routing tools.

This concept of using path segments is further illustrated with respect to FIGS. 3a through 3d. In particular, the path object 101 of FIGS. 1 and 2 is shown repeated as FIG. 3a, with arrows identifying portions of path object 101 that may be implemented as path segment objects 305, 310, and 315 (i.e., 3 separate database objects) by an automatic layout tool for connecting points 108 and 105 (FIG. 1). Each path segment object is specified by a start point and an end point. For example, object 305 is defined by points 108 and 301, while object 310 is defined by points 311 and 106. The points 301 and 311 would generally be defined using the same physical (x,y) coordinate (i.e., the same physical point in two-dimensional space), because the end point of one path segment object also is the start for the next path segment object. However, to emphasize that segment 305 and segment 310 are separate database objects, these points are separately numbered, being distinct stored values for each database object.

One implication of having logically separate path segments composing a single path of layout is illustrated in FIG. 5. Here, a cursor position is illustrated by number 510. If a user selected the point on a screen illustrated by a cursor position 510, then a layout tool would select path segment object 315, even though the user may preferably have wanted to select the entirety of the physical interconnect (i.e., the layout defined by path segment objects 305, 310, and 315) connecting points 108 and 105. Instead, a remainder of such path segment objects (310 and 305) illustrated in outline and collectively numbered 505 would remain unselected.

One accommodation in this regard is illustrated in FIG. 4. Here, cursor click 410 is illustrated also as being in a position to select path segment object 315. However, a mode can be provided that will allow selection of all electrically connected database objects (i.e., a net). For a simple configuration of interconnect elements, such as that illustrated in FIG. 4, this may be the desired behavior of the tools. However, more complicated situations exist where a designer may not desire to have selected all electrically connected path segment objects simply because the designer had clicked on one such path segment object.

SUMMARY

Aspects relate to providing a capability for a user to have assistance from a layout editor in selecting layout objects according to the examples, aspects, and other criteria presented. These aspects can be embodied in systems, methods, and computer readable media and can be used in editing and producing layout to be included in a fabricated integrated circuit.

Method aspects may include displaying a depiction of layout for an integrated circuit, the layout defined by database objects. Each database object being a respective single-width portion of layout, and formed on any one of multiple interconnect layers, and having respective first and second ends. Generally, a start and an end for each database object is defined as a separate point stored in a database, e.g., an (X,Y) coordinate. For an object having turns, each turn also can be defined by a point stored in the database for such object. For example, points 105 and 108 define start and end points for path object 101 (labeling either point as a start or as an end is arbitrary in this example).

The method includes accepting a user selection of one of the database objects as a start of a spine definition, and setting the first end of the selected object as a current end of a current object. The method also comprises determining, whether the current end of the current object corresponds to a first end of a single additional database object, of the same width, on the same layer, and of the same net as the current object, and if so then the method comprises adding the additional object to the spine definition, and repeating the determining with the second end of the additional database object as the current end of the current object.

The method also comprises determining whether the current end of the current object corresponds to first ends of two or more additional database objects, and if so then determining whether exactly one of the two or more additional database objects is of the same width, on the same layer, and of the same net as the current object, and if so then adding that one additional database object to the spine definition and repeating the original determining with that one additional database object as the current object.

If not then the method comprises determining whether exactly one of the two or more additional database objects has a first end segment collinear with a segment of the current end of the current object, and if so then adding that additional database object to the spine definition and repeating the original determining with that one additional database object as the current object.

If not then the method comprises terminating an end of the spine definition corresponding to the current end of the current object, and repeating the original determining step with the second end of the selected object as the current end of the current object; and outputting an indication of database objects comprising the spine definition.

Other aspects can include implementations that first use co-linearity of an end to a spine being defined with potential objects that may be added to the spine. For example, a method (can be implemented by computer instructions stored on suitable media) can comprise accepting a selection of a layout object defining a portion of layout for a net, and adding the selected object to a spine definition. A current object can be identified as the selected object, and a first end of the selected object as a current end. The spine definition can be supplemented by adding to the spine definition any other layout object having a first end collinear with and corresponding to the current end of the current object, and of the same width, on the same layer and the same net. The other layout object can then be the current object, and a second end of the other layout object can be the current end of the current object, and the adding above can be repeated for further layout objects meeting the criteria set forth. Upon not adding an object to the spine definition based on the above repetition, the spine can then be added to by adding to the spine definition any single non-collinear object having a first end corresponding to the current end of the current object, and of the same width, on the same layer, and of the same net as the current object, setting the non-collinear object as the current object and a second end of the non-collinear object as the current end. The spine analysis can then be repeated from the co-linear analysis above. The method also comprises terminating an end of the spine corresponding to the current object if no object was added in the above steps. If both ends of the spine are not yet terminated, then the above analysis can be repeated for a non-terminated end of the spine (the selected object).

In these aspects, what may be termed as two determinations or decisions, such as determining whether a single or multiple layout objects start/end at a given point (or correspond to a given other layout object), can be implemented as a single determination. Other such considerations also can be envisioned based on the examples and other aspects described.

BRIEF SUMMARY OF THE FIGURES

FIGS. 1, 2, 3a-d, 4 and 5 illustrate background aspects of integrated circuits, including the automatic construction of path segment objects by layout tools;

FIG. 6 illustrates one electrically connected net formed on multiple layers and having a plurality of portions that are of differing widths, and that such a net can be displayed on a computer display for editing;

FIGS. 8a-8e illustrate a build of a spine according to examples and aspects herein;

DETAILED DESCRIPTION

FIG. 6 is used for illustrating layout for a net 600 (an electrically connected plurality of pieces of physical layout) formed from layout defined by numerous database objects, and a designer may desire to select a portion of those database objects (i.e., layout defined by those objects). Often, layout defined by each of the different database objects can be formed on different interconnect layers, and thus can be connected by vias to other layout of net 600.

In FIG. 6, layout portion 623 is connected by via 605 to the remainder of the net 600. Further with regard to FIG. 6, W indicates that those path segments all have the same width (W). Other layout portions that are part of net 600 includes layout portions 622, 621, and 601.

Figure 7:
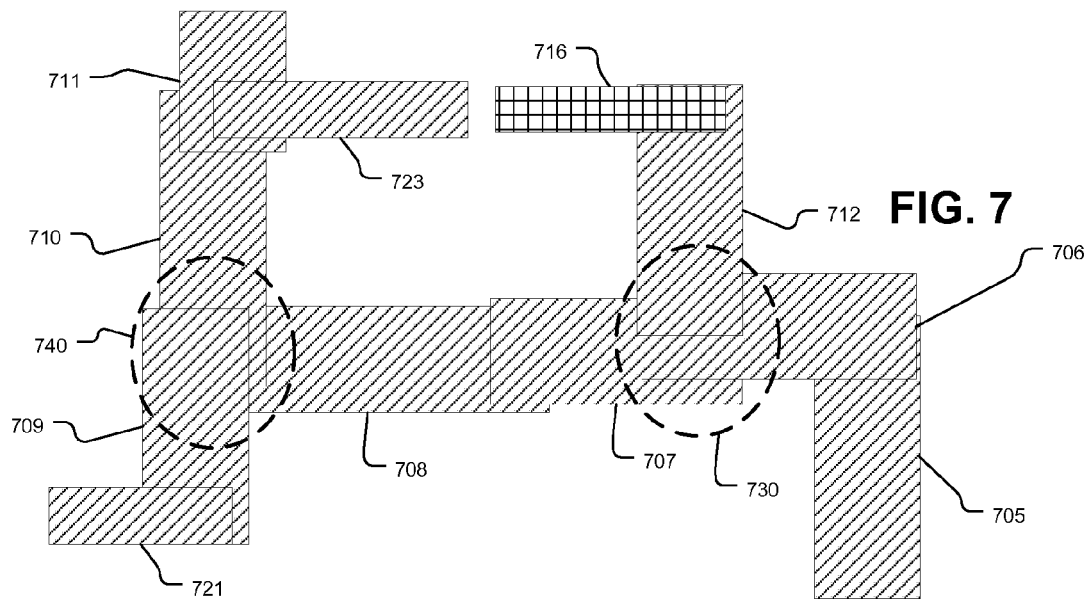
FIG. 7 illustrates an example construction of the net of FIG. 6 with path segments.

FIG. 7 illustrates an implementation of net 600. In this example, and those that follow, a piece of layout is defined by data contained in a database object, so for ease of reference, layout defined by an object (e.g., a depiction of a physical realization of the layout on a display) is sometimes referred to as the database object itself (e.g., object 708 can refer to layout defined by object 708). Also, the term object is used generically to refer to path database objects, and path segment database objects (as described in the Background). A path database object is defined on a single interconnect layer by a start point, zero or more intervening points defining zero or more additional intermediate layout segments, and an end point, and a single width for the layout. A path segment database object is defined on a single interconnect layer by a start point, and end point, and a single width.

As can be discerned, objects of FIG. 7 composing net 600 are shown as partially overlapping, to diagrammatically indicate that such overlapping objects share end points. The separate objects also indicate that at changes in direction of net 600, a new layout database object can be used. For example, considering region 740 where net 600 includes a T intersection, that intersection is decomposed into objects 708, 709, and 710. Likewise, region 730 illustrates a T intersection formed by objects 707, 706 and 712. Regions 730 and 740 illustrate intersections between objects formed on the same layer and having the same width. However, intersections can also be formed between objects having different widths, but yet are formed on the same interconnect layer. An example of this occurrence is the intersection between object 723 and object 711. Also, intersections between objects formed on different layers can exist, for example, object 716 shares an end point with object 712 and would be electrically connected with a via as described with respect to FIG. 6.

As introduced with respect to FIGS. 4 and 5, a designer currently may be presented with an editing mode that would allow selection of all the objects electrically connected to form net 600, or a designer presently may be permitted to select any one of the objects composing net 600 individually. However such modes or selection behaviors may not be helpful to a designer in a particular circumstance where a designer desires to select a portion of net 600 that would comprise a logically distinct portion of net 600.

In these examples and aspects, one logically distinct portion of net 600 of interest is referred to as a "spine", and can be defined according to examples and situations described herein. In some situations, an additional mode may be presented in a layout editor that would provide functionality to select a spine according to these examples.

Figure 8A:
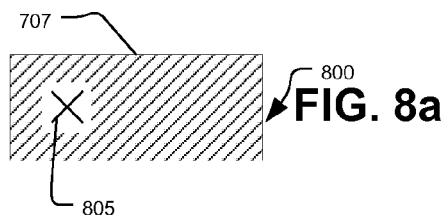
Figure 10:
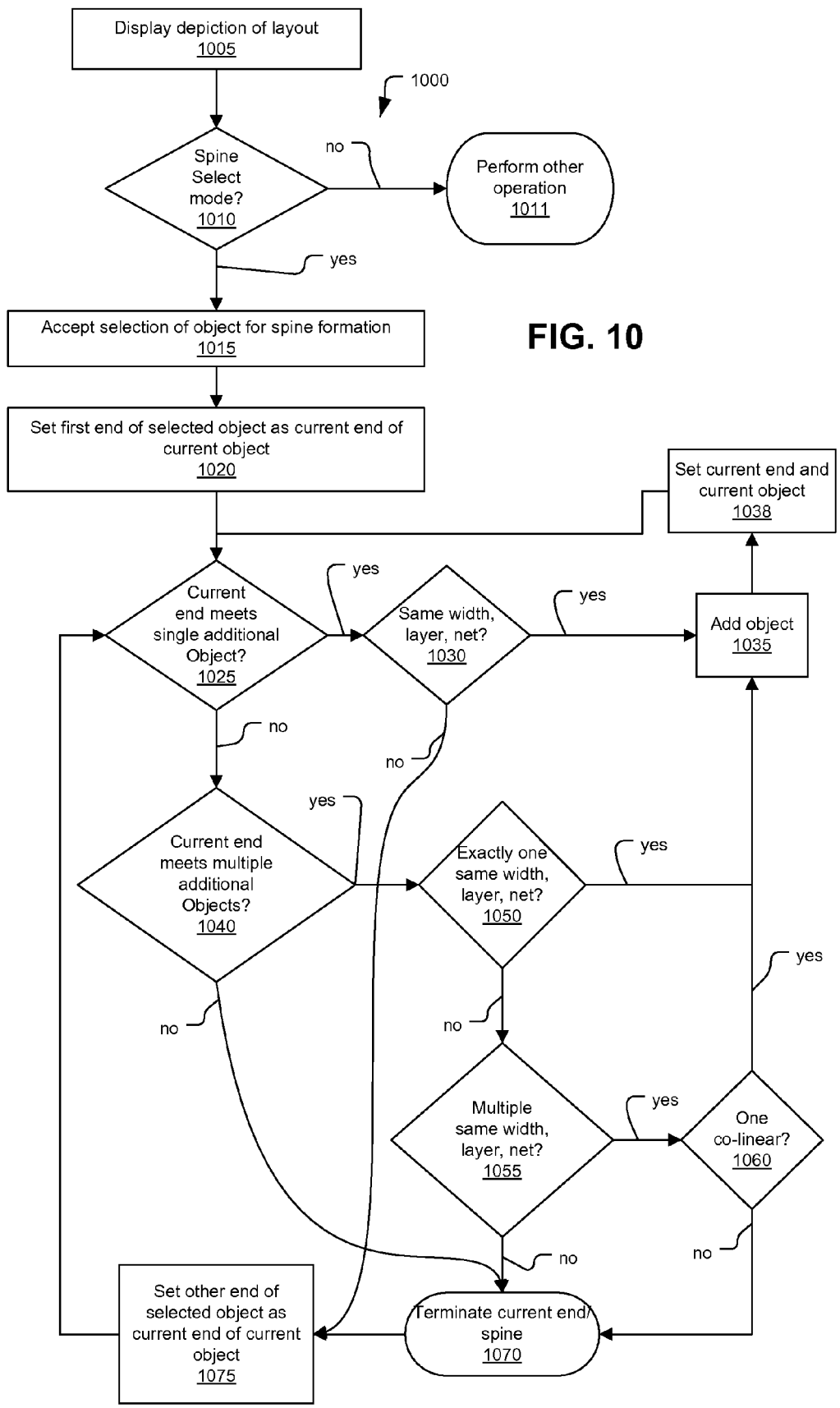
FIG. 10 illustrates steps of a method that can be implemented to result in the spines constructed in the examples of FIGS. 8a-8e and FIGS. 9a-9c.

Now turning to FIG. 8a, the description of how a spine may be extracted from net 600 is begun. In these examples, objects shown either are single segment path database objects or path database objects. As discussed above, path database objects can have multiple segments and the examples described here apply equally to such path database objects. Reference also is made to portions of method 1000 of FIG. 10.

Method 1000 can begin by depicting (1005) a portion of layout on a display. A user may select (1010) a spine selection mode from among a number of modes that control a system's interpretation of a user's actions. In method 1000, if a spine select mode was not selected, then a user's actions may be interpreted differently than the spine selection mode behavior described below, as identified by another action performed (1011) in FIG. 10.

Referencing FIG. 8a, the object 707 is shown to be selected by, for example, mouse click 805 (or any other way to receive an indication of object selection) (method step 1015). This is considered to be a first object added to a list of objects composing spine 800 (e.g., a spine definition). As each database object defines layout having a first end and a second end, a first end of the selected object 707 is defined (step 1020) as a current end of a current object. In most implementations, it is preferred to define database objects using points defining coordinates for their respective starting position, ending position, and any intermediate turns (for objects that can have 1 or more turns, such as a path object).

Then, it is determined (step 1025) whether the current end of the current object (in one instance, object 707) corresponds to a first end of a single additional database object that is of the width, formed on the same layer, and part of the same electrical net as the current object 707 (step 1030). If there is such an object, then that object also is added (step 1035) to the spine definition.

Figure 8B:
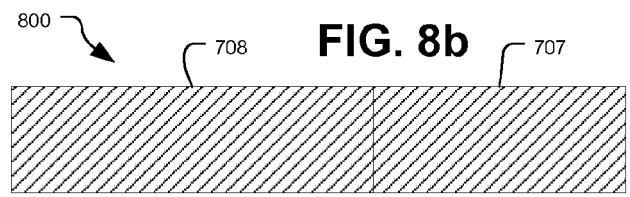

In the example of object 707, it can be determined that only object 708 meets object 707 at the assigned current end of current object 707 (FIG. 8b). Also, it can be determined that object 708 has the same width as object 707 (i.e., layout defined by object 708 is same width as layout defined by object 707). Therefore, object 708 can be added to the spine definition (FIG. 8b).

Figure 8C:
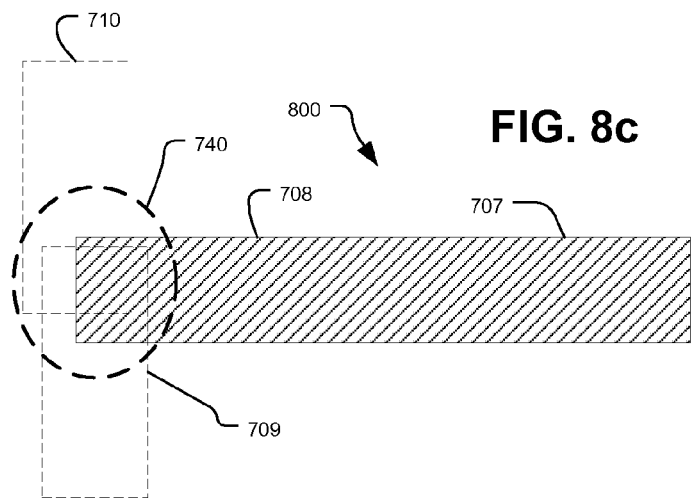

Then, in FIG. 8c, object 708 is assigned (step 1038) to be the current object and the far end of object 708 to be the current end of the current object. The method 1000 returns to step 1025. Again at step 1025, it is determined that object 708 meets objects 709 and 710 in region 740 (FIG. 8c), so method 1000 proceeds to step 1040, where it is determined that the current end meets multiple additional objects (of course, this step can also be combined with step 1025 in that a number of objects meeting at a given point can be once determined, but is split out for the sake of explanation.) Then it is determined (step 1050) whether exactly one of these objects is the same width, layer, and net as the current object. In this case, it is determined (steps 1050/1055) that more than one of objects 709 and 710 (illustrated in outline) meet these criteria, and it also is then determined (step 1060) that neither object 709 or object 710 is co-linear, so method 1000 proceeds to terminate (step 1070) the current end, and set (step 1075) the other end of the selected object as the current end of the current object, and return to step 1025.

In FIG. 8d, and again at step 1025 with the other end of object 707, method 1000 gets to step 1055 again, based on similar considerations as those described above (with objects 712 and 706 being two (multiple) objects defining layout of the same width, same layer, same net as object 707 and meeting object 707 at region 730). However, in this case, step 1060 finds that object 706 is collinear with object 707, while object 712 is not (region 730). So, object 706 is added (1035) to the spine definition, object 706 is defined (1038) as the current object, and the far end of object 706 is defined as the current end. In FIG. 8e, method 1000 returns to step 1025, where it is determined that object 706 meets only object 705, and it is also determined (730) that object 705 is same width, layer, and net as object 706, so object 706 is added (1035) to the spine definition. The current object now is object 706, and its far end is the current end.

Still in FIG. 8e, method 1000 again returns to step 1025, and then to step 1040, as it is determined that there are neither single nor multiple additional objects corresponding to the current end of the current object; meaning that there are no additional objects. Therefore, the spine is terminated (1070), since both ends of the originally selected object have been explored until no further layout objects meeting the outlined criteria are identifiable.

Figure 9A:
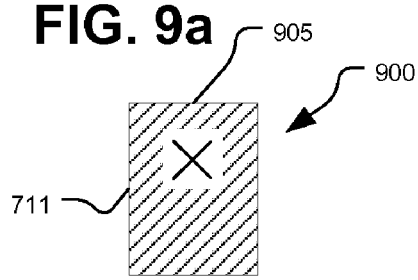
FIGS. 9a-9c illustrate a build of a second spine according to examples and aspects presented herein.
Figure 9B:
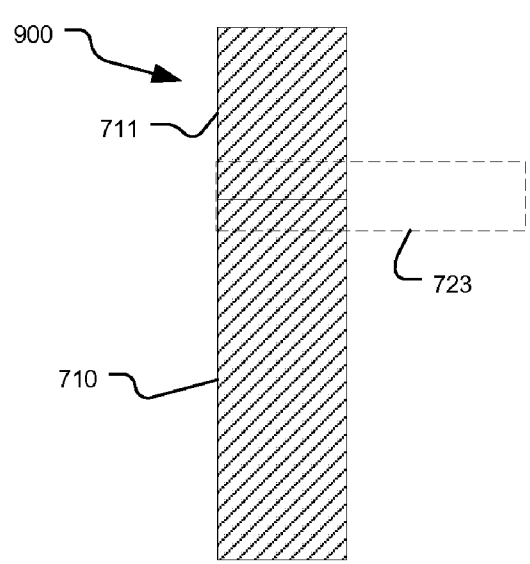
Figure 9C:
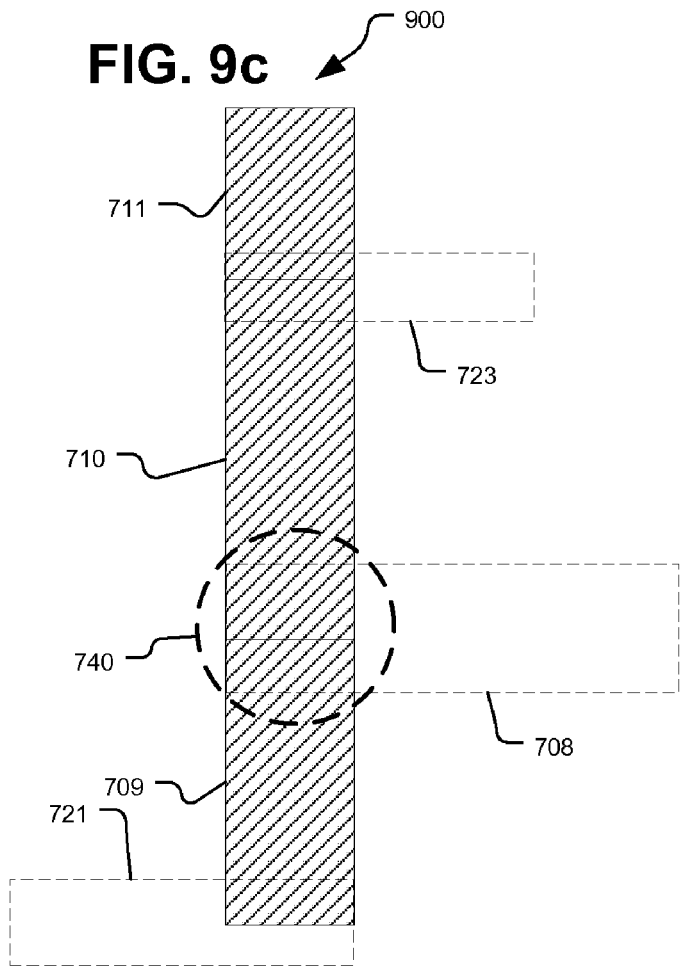

FIGS. 9a-9c are used to show a contrasting result. Here, a designer is shown as selecting object 711 with selection 905, and begins spine 900. As shown in FIG. 7, object 711 intersects objects 723 and 710. Referencing method 1000, the decision process is through step 1025, step 1040, and step 1050, where it can be determined that only object 710 is of the same width, layer, and net as object 711, and can be added to the spine 900 (step 1035.)

Object 723 is not added to spine 900, as it is not of the same width as object 711. A separate, independent, and alternative reason is that object 710 is co-linear with object 711, while object 723 is not.

Now, in FIG. 9c, object 710 is the current object, and its end remote from object 711 is the current end. It is determined that the current object proceeds through steps 1025, 1040, 1050, and 1055, to determined that multiple same width, layer, and net objects meet the current object (objects 708 and 709). So, at step 1060, it is determined that only object 709 is collinear, is added to spine 900, and is now the current object. Since object 721 is not the same width as object 709, it is not added to the spine, and that end of the spine terminates 1070. Since selected object 711 has no objects corresponding to its other end (steps 1025, 1040), that end also will terminate 1070.

Thus, it is apparent that a spine composed of a selection of layout objects defining a net, according to present aspects, can depend on what object was selected initially as an object that is to be part of the spine. For example, by selecting an object on a lateral portion of net 600, a predominantly lateral spine can result, while selecting an object on a vertical portion of net 600 can result in a predominantly vertical spine (although outcomes may vary, depending on the nature of a given spine.)

In method 1000, certain steps were separately identified for the sake of clarity and explanation. However, some steps may allow a conclusion as to the existence of other conditions, and so certain steps may not need to be separately executed. For example, the separately recited steps 1025, 1040, and 1050/1055 may be combined into respectively single steps with multiple branches therefrom. Also, there is no requirement that the analysis of each end of the selected segment proceed sequentially, as they also can proceed in parallel.

Also, co-linearity can be used as a more primary decision criteria, in that a spine definition can be formed based first on a selected object, then adding any single other layout object having a first end collinear with and corresponding to the current end of the current object, and of the same width, on the same layer and the same net, and looping until no more objects were added on this basis. Since objects can have parts that are not co-linear with each other (i.e., path objects can have turns), a decision criterion can be whether the joining ends are co-linear, and not whether an entire object is co-linear with another.

Then, following on the far end of any added objects, the spine definition can then be extended by adding any single non-collinear object having a first end corresponding to the current end of the current object, and of the same width, on the same layer, and of the same net as the current object. In other words, if there is an object with a qualifying co-linear end, then whether that object is single or also with other objects non-colinear can be deemed irrelevant. When there is no collinear object, then only a single qualifying object should be present, or else the spine definition on that end should terminate (e.g., a T junction, coming from the bottom, should terminate).

In all cases, the term "width" can be considered within an approximation appropriate under the circumstances, and not to any particular degree of mathematical precision.

Figure 11:
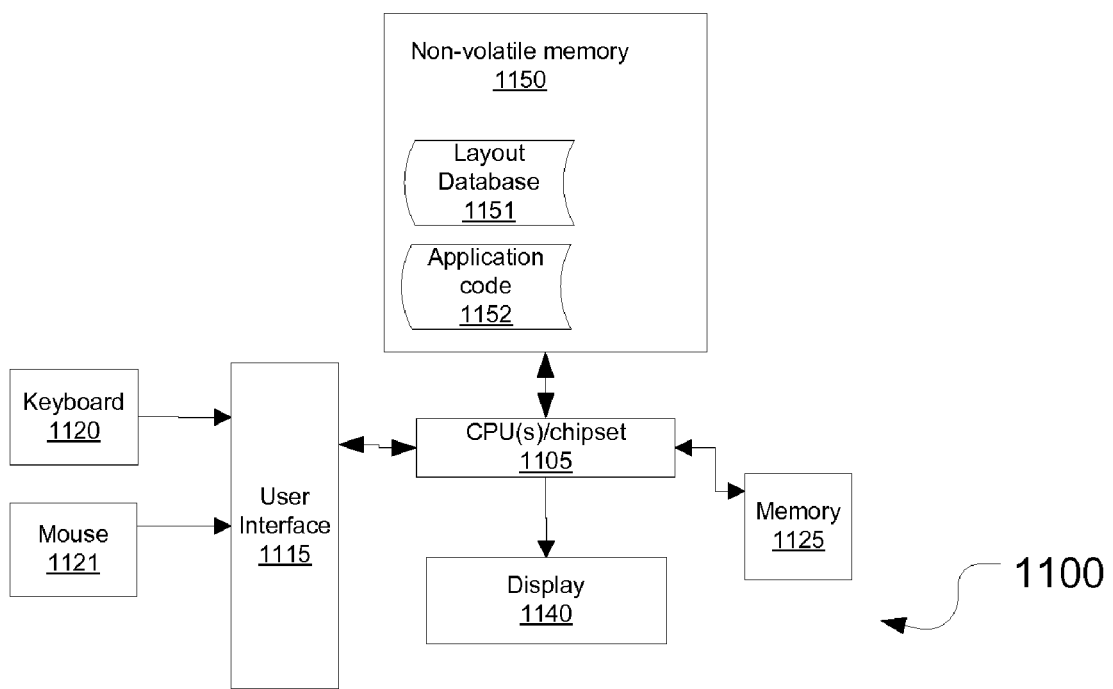
FIG. 11 illustrates a computer system in which such methods can be implemented.

FIG. 11 illustrates a computer system 1100 in which methods according to the examples and aspects of the above description may be implemented. Computer system 1100 includes keyboard 1120, mouse 1121 connected to a user interface 1115, which in turn connects these user interface tools to a CPU/chipset 1105. In some implementations, CPU/chipset 1105 may comprise a plurality of physically separate chips interconnected by means such as traces on a motherboard, or intrapackage connections, and the like. CPU/chipset 1105 may also comprise various caches and other supporting circuitry. CPU/chipset 1105 communicates with a memory 1125 in which it can store programs and other data for executing programs, as well as a non-volatile memory 1150 in which such programs and data can be stored when not more immediately needed or being used. For example, a layout database 1151 can store layout objects discussed herein. This database can be an OpenAccess database. Memory 1150 can store application code 1152. In system 1100, a display 1140 is driven by user interface 1115, but in other examples, display 1140 can be driven by circuitry contained within CPU/chipset 1105, or by a chip driven by CPU/chipset 1105.

Methods and other implementations can be distributed among a plurality of computers connected in a network. When information is transferred or provided over a network or another communications connection (either hardwired, wireless, or a combination of hardwired or wireless) to a computer, the computer uses that connection as a computer-readable medium. Thus, by way of example, and not limitation, computer-readable media can also comprise a network or data links which can be used to carry or store desired program code means in the form of computer-executable instructions or data structures and which can be accessed by a general purpose or special purpose computer.

Computer-executable instructions comprise, for example, instructions and data which cause or otherwise configure a general purpose computer, special purpose computer, or special purpose processing device to perform a certain function or group of functions. The computer executable instructions may be, for example, binaries, intermediate format instructions such as assembly language, or source code. For example, systems, software, and methods can include providing a mode allowing activation of the functionality described herein. For example, a mode can be provided in a layout editor, such as Virtuoso, by Cadence Design Systems, Inc. implementing such functionality.

Although some subject matter may have been described in language specific to examples of structural features and/or method steps, it is to be understood that the subject matter defined in the appended claims is not necessarily limited to these described features or acts. Rather, the described features and steps are disclosed as examples of components of systems and methods within the scope of the appended claims.

I claim:

1. A computer readable storage device, storing computer instructions for computer implementation of a method for interactive editing of layout for integrated circuits, comprising:
   (a) displaying, using a computer system, a depiction of layout for an integrated circuit, the layout defined by database objects, each being a respective single-width portion of layout, formed on any one of multiple interconnect layers, and having respective first and second ends;
   (b) accepting a user selection of one of the database objects as a start of a spine definition;
   (c) setting the first end of the selected object as a current end of a current object;
   (d) determining whether the current end of the current object corresponds to a first end of a single additional database object, of the same width, on the same layer, and of the same net as the current object, and if so, then adding the additional object to the spine definition, and repeating (d) with the second end of the additional database object as the current end of the current object;
   (e) determining, using the computer system, whether the current end of the current object corresponds to first ends of two or more additional database objects, and if so then
      (e)(1) determining whether exactly one of the two or more additional database objects is of the same width, on the same layer, and of the same net as the current object, and if so then adding that one additional database object to the spine definition and repeating (d) with that one additional database object as the current object, if not then
      (e)(2) determining whether exactly one of the two or more additional database objects has a first end segment collinear with a segment of the current end of the current object, and if so then adding that additional database object to the spine definition and repeating (d) with that one additional database object as the current object, and if not then
      terminating an end of the spine definition corresponding to the current end of the current object;
   (f) repeating (d) with the second end of the selected object as the current end of the current object; and
   (g) outputting an indication of database objects comprising the spine definition.

2. The computer readable storage device of claim 1, wherein the database objects comprise path segments objects generated by a tool implementing a functional circuit description.

3. The computer readable storage device of claim 1, further comprising allowing group manipulation of the database objects comprising the spine definition.

4. The computer readable storage device of claim 1, wherein the outputting includes displaying layout defined by the database objects of the spine definition within a layout editor.

5. The computer readable storage device of claim 1, further comprising providing for reception of a user selection indicative of a spine selection mode.

6. The computer readable storage device of claim 5, wherein the spine selection mode is a mode of a plurality of modes including a net selection mode and a interconnect layer selection mode.

7. The computer readable storage device of claim 1, wherein processing of the second end of the selected object proceeds in parallel with processing of the first end of the selected object.

8. An integrated circuit comprising a net designed according to a method comprising:
   (a) displaying, using a computer system, a depiction of layout for an integrated circuit, the layout defined by database objects, each being a respective single-width portion of layout, formed on any one of multiple interconnect layers, and having respective first and second ends;
   (b) accepting a user selection of one of the database objects as a start of a spine definition;
   (c) setting the first end of the selected object as a current end of a current object;
   (d) determining, whether the current end of the current object corresponds to a first end of a single additional database object, of the width, on the same layer, and of the same net as the current object, and if so then adding the additional object to the spine definition, and repeating (d) with the second end of the additional database object as the current end of the current object;
   (e) determining, using the computer system, whether the current end of the current object corresponds to first ends of two or more additional database objects, and if so then
      (e)(1) determining whether exactly one of the two or more additional database objects is of the same width, on the same layer, and of the same net as the current object, and if so then adding that one additional database object to the spine definition and repeating (d) with that one additional database object as the current object, if not then
      (e)(2) determining whether exactly one of the two or more additional database objects has a first end segment collinear with a segment of the current end of the current object, and if so then adding that additional database object to the spine definition and repeating (d) with that one additional database object as the current object, and if not then
      terminating an end of the spine definition corresponding to the current end of the current object;
   (f) repeating (d) with the second end of the selected object as the current end of the current object; and
   (g) accepting edits to the spine definition and modifying the database objects comprising the spine definition to reflect those edits.

9. The method of claim 8, wherein at least some of the database objects were generated by a tool operable for generating layout that implements a functional circuit description.

10. The method of claim 9, further comprising displaying layout from the database objects comprising the spine definition within a layout editor.

11. The method of claim 10, further comprising providing for reception of a user selection indicative of a spine selection mode.

12. The method of claim 11, wherein the spine selection mode is a selectable mode from among a plurality of modes including a net selection mode and an interconnect layer selection mode.

13. A method for use in editing of layout for integrated circuits, comprising:
   (a) displaying, using a computer system, a depiction of layout for an integrated circuit, the layout defined by database objects, each being a respective single-width portion of layout, formed on any one of multiple interconnect layers, and having respective first and second ends;
   (b) accepting a user selection of one of the database objects as a start of a spine definition;
   (c) setting the first end of the selected object as a current end of a current object;
   (d) determining, whether the current end of the current object corresponds to a first end of a single additional database object, of the width, on the same layer, and of the same net as the current object, and if so then adding the additional object to the spine definition, and repeating (d) with the second end of the additional database object as the current end of the current object;
   (e) determining, using the computer system, whether the current end of the current object corresponds to first ends of two or more additional database objects, and if so then
      (e)(1) determining whether exactly one of the two or more additional database objects is of the same width, on the same layer, and of the same net as the current object, and if so then adding that one additional database object to the spine definition and repeating (d) with that one additional database object as the current object, if not then
      (e)(2) determining whether exactly one of the two or more additional database objects has a first end segment collinear with a segment of the current end of the current object, and if so then adding that additional database object to the spine definition and repeating (d) with that one additional database object as the current object, and if not then
      terminating an end of the spine definition corresponding to the current end of the current object;
   (f) repeating (d) with the second end of the selected object as the current end of the current object; and
   (g) accepting edits to the spine definition and modifying the database objects comprising the spine definition to reflect those edits.

14. The method of claim 13, wherein the database objects comprise path segments objects generated by a tool implementing a functional circuit description.

15. The method of claim 13, further comprising allowing group manipulation of the database objects comprising the spine definition.

16. The method of claim 13, further comprising displaying layout defined by the database objects of the spine definition within a layout editor.

17. The method of claim 13, further comprising providing for reception of a user selection indicative of a spine selection mode.

18. The method of claim 13, wherein the spine selection mode is a mode of a plurality of modes including a net selection mode and an interconnect layer selection mode.

19. A computer readable storage device storing computer instructions for computer implementation of a method for interactive editing of layout for integrated circuits, comprising:
   (a) displaying, using a computer system, a depiction of layout for an integrated circuit, the layout defined by database objects, each being a respective single-width portion of layout, formed on any one of multiple interconnect layers, and having respective first and second ends;

(b) accepting a user selection of one of the database objects as a start of a spine definition;
(c) setting the first end of the selected object as a current end of a current object;
(d) determining, using the computer system, a number of additional database objects corresponding to the current end of the current object,
  (1) if the current end of the current object corresponds to a single additional database object at a first end, and is of the same width, on the same layer, and of the same net as the current object, then adding the additional object to the spine definition, and repeating (d) with a second end of the additional database object as the current end of the current object,
  (2) if the current end of the current object corresponds to two or more additional database objects then determining whether exactly one of the two or more additional database objects is of the same width, on the same layer, and of the same net as the current object, and if so then
    i. adding that one additional database object to the spine definition and repeating (d) with that one additional database object as the current object, if not then
    ii. determining whether exactly one of the two or more additional database objects has a first end portion collinear with the current end of the current object, and if so then adding that additional database object to the spine definition and repeating (d) with that one additional database object as the current object, and if not then
    iii. terminating an end of the spine definition corresponding to the current end of the current object;
(f) repeating (d) with the second end of the selected object as the current end of the current object; and
(g) outputting an indication of database objects comprising the spine definition.

20. A computer system comprising:
(a) means for displaying, using a computer system, a depiction of layout for an integrated circuit, the layout defined by database objects, each being a respective single-width portion of layout, formed on any one of multiple interconnect layers, and having respective first and second ends;
(b) means for accepting a user selection of one of the database objects as a start of a spine definition;
(c) means for setting the first end of the selected object as a current end of a current object;
(d) means for determining, whether the current end of the current object corresponds to a first end of a single additional database object, of the width, on the same layer, and of the same net as the current object, and if so then adding the additional object to the spine definition, and repeating (d) with the second end of the additional database object as the current end of the current object;
(e) means for determining, using the computer system, whether the current end of the current object corresponds to first ends of two or more additional database objects, and if so then
  (e)(1) determining whether exactly one of the two or more additional database objects is of the same width, on the same layer, and of the same net as the current object, and if so then adding that one additional database object to the spine definition and repeating (d) with that one additional database object as the current object, if not then
  (e)(2) determining whether exactly one of the two or more additional database objects has a first end segment collinear with a segment of the current end of the current object, and if so then adding that additional database object to the spine definition and repeating (d) with that one additional database object as the current object, and if not then
  terminating an end of the spine definition corresponding to the current end of the current object;
(f) means for repeating (d) with the second end of the selected object as the current end of the current object; and
(g) means for accepting edits to the spine definition and modifying the database objects comprising the spine definition to reflect those edits.

* * * * *